United States Patent
Regau et al.

(10) Patent No.: US 9,857,062 B2
(45) Date of Patent: Jan. 2, 2018

(54) ORGANIC LIGHT-EMITTING DIODE AND ARRANGEMENT WITH SUCH A LIGHT-EMITTING DIODE

(71) Applicant: OSRAM OLED GmbH, Regensburg (DE)

(72) Inventors: Kilian Regau, Regensburg (DE); Karsten Diekmann, Rattenberg (DE); Christian Kristukat, Buenos Aires (AR)

(73) Assignee: OSRAM OLED GmbH (DE)

( * ) Notice: Subject to any disclaimer, the term of this patent is extended or adjusted under 35 U.S.C. 154(b) by 132 days.

(21) Appl. No.: 14/902,673

(22) PCT Filed: Jul. 3, 2014

(86) PCT No.: PCT/EP2014/064222
§ 371 (c)(1),
(2) Date: Jan. 4, 2016

(87) PCT Pub. No.: WO2015/001038
PCT Pub. Date: Jan. 8, 2015

(65) Prior Publication Data
US 2016/0169487 A1    Jun. 16, 2016

(30) Foreign Application Priority Data

Jul. 4, 2013    (DE) .................. 10 2013 107 057

(51) Int. Cl.
*F21V 19/00* (2006.01)
*H01L 51/52* (2006.01)
(Continued)

(52) U.S. Cl.
CPC .............. *F21V 19/003* (2013.01); *F21K 9/66* (2016.08); *H01L 51/52* (2013.01);
(Continued)

(58) Field of Classification Search
CPC .......... F21V 19/003; F21K 9/66; F21K 9/232; F21K 9/13; H01L 51/52; H01L 51/5203;
(Continued)

(56) References Cited

U.S. PATENT DOCUMENTS 9,426,848 B2 * 8/2016 Yamazaki
2007/0263393 A1 * 11/2007 Van De Ven ....... F21V 29/2212
362/362

(Continued)

FOREIGN PATENT DOCUMENTS

CN        101841006         9/2010
DE    10 2011 077 687 A1    12/2012
(Continued)

OTHER PUBLICATIONS

Chinese Search Report dated Aug. 10, 2016, of corresponding Chinese Application No. 201480038154.8 in English.
(Continued)

*Primary Examiner* — Laura Tso
(74) *Attorney, Agent, or Firm* — DLA Piper LLP (US)

(57) ABSTRACT

An organic light-emitting diode includes a substrate with a top; an organic layer on the top that generates radiation; first and second electrical contact area at or on the top that electrically contacts the diode; a holding device by which the diode is mechanically supported and electrically contacted; and a cover sheet on a side of the organic layer remote from the substrate that protects the organic layer, wherein at least one opening is in the cover sheet and the opening, in plan view, is surrounded by the cover sheet and the organic layer; the areas are located at an edge of the opening and freely accessible; the device engages through the opening; the first area has a different average distance from the opening than the second area; and the electrical areas are each arranged concentrically around the opening (Continued)

and partially or completely surround the opening in plan view.

13 Claims, 6 Drawing Sheets

(51) Int. Cl.
   *F21K 9/66*      (2016.01)
   *F21Y 115/10*    (2016.01)
   *F21K 9/232*     (2016.01)

(52) U.S. Cl.
   CPC ........ H01L 51/5203 (2013.01); H01L 51/524 (2013.01); H01L 51/5253 (2013.01); *F21K 9/232* (2016.08); *F21Y 2115/10* (2016.08); *H01L 2251/5361* (2013.01); *H01L 2251/558* (2013.01)

(58) Field of Classification Search
   CPC ............... H01L 51/524; H01L 51/5253; H01L 2251/5361; H01L 2251/558; F21Y 2115/10; F21Y 2105/006; H05B 33/0896; H05B 33/08; F21S 6/00; F21S 8/033; F21S 8/04

USPC .................. 362/388, 311.02, 249.02, 800
   See application file for complete search history.

(56) References Cited

U.S. PATENT DOCUMENTS

| | | |
|---|---|---|
| 2010/0237373 A1 | 9/2010 | Yamazaki et al. |
| 2010/0237774 A1 | 9/2010 | Yamazaki et al. |

FOREIGN PATENT DOCUMENTS

| | | |
|---|---|---|
| DE | 10 2011 056 570 A1 | 6/2013 |
| EP | 2 293 358 A1 | 3/2011 |
| JP | 2007-173424 A | 7/2007 |
| KR | 2013-0099502 A | 9/2013 |
| WO | 2010/022102 A2 | 2/2010 |
| WO | 2011/068277 A1 | 6/2011 |
| WO | 2011/161608 A1 | 12/2011 |

OTHER PUBLICATIONS

The Second Chinese Office Action dated Mar. 20, 2017, of corresponding Chinese Application No. 201480038154.8 in English.

* cited by examiner

ORGANIC LIGHT-EMITTING DIODE AND ARRANGEMENT WITH SUCH A LIGHT-EMITTING DIODE

TECHNICAL FIELD

This disclosure relates to an organic light-emitting diode and an arrangement with such a light-emitting diode.

BACKGROUND

It could be helpful to provide an organic light-emitting diode which is efficiently mountable and electrically contactable.

SUMMARY

We provide an organic light-emitting diode including a substrate with a substrate top; at least one active organic layer on the substrate top that generates radiation; at least one first and at least one second electrical contact area at or on the substrate top that electrically contacts the light-emitting diode; a holding device by which the organic light-emitting diode is both mechanically supported and electrically contacted; and a cover sheet on a side of the organic layer remote from the substrate that protects the organic layer, wherein at least one opening is formed in the cover sheet and the opening, when viewed in plan view, is completely surrounded by the cover sheet and the organic layer; the electrical contact areas are located at an edge of the opening and are freely accessible; the holding device engages through the opening; the first contact area has a different average distance from the opening than the second contact area; and the electrical contact areas are each arranged concentrically around the opening and each partially or completely surround the opening when viewed in plan view.

We also provide an arrangement including at least one organic light-emitting diode including a substrate with a substrate top; at least one active organic layer on the substrate top that generates radiation; at least one first and at least one second electrical contact area at or on the substrate top that electrically contacts the light-emitting diode; a holding device by which the organic light-emitting diode is both mechanically supported and electrically contacted; and a cover sheet on a side of the organic layer remote from the substrate that protects the organic layer, wherein at least one opening is formed in the cover sheet and the opening, when viewed in plan view, is completely surrounded by the cover sheet and the organic layer; the electrical contact areas are located at an edge of the opening and are freely accessible; the holding device engages through the opening; the first contact area has a different average distance from the opening than the second contact area; and the electrical contact areas are each arranged concentrically around the opening and each partially or completely surround the opening when viewed in plan view, and wherein the holding device is fitted to a ceiling or a wall using a fastening unit, the fastening unit is at least one of a screw, a sharpened bard, or a plug-in connector.

We further provide an organic light-emitting diode including a substrate with a substrate top, at least one active organic layer on the substrate top that generates radiation, at least one first and at least one second electrical contact area at or on the substrate top that electrically contact the light-emitting diode, and a cover sheet on a side of the organic layer remote from the substrate that protects the organic layer, wherein at least one opening is formed in the cover sheet and the opening, when viewed in plan view, is completely surrounded by the cover sheet and by the organic layer, and the electrical contact areas are located at an edge of the opening and are freely accessible.

DETAILED DESCRIPTION

Figure 1A:
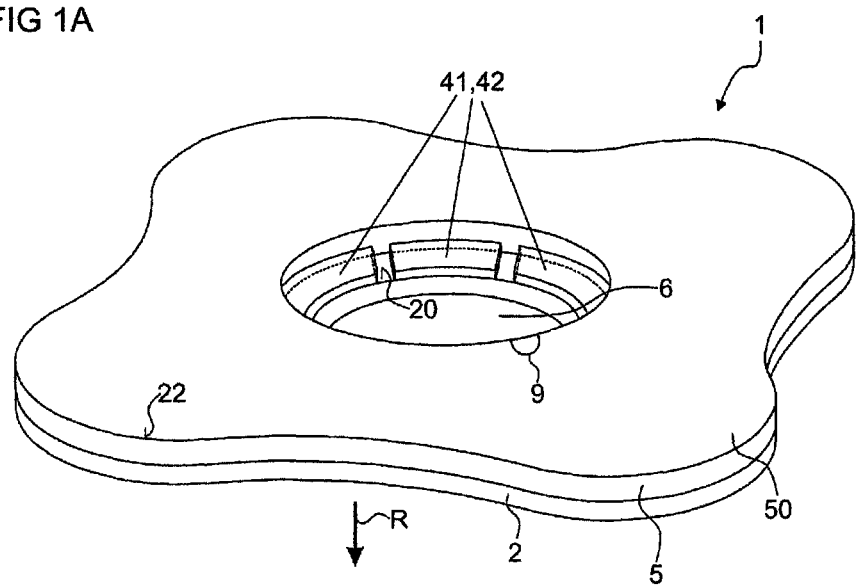
FIGS. 1A, 1B, 2, 3, 4, 5A, 5AA, 5B, 5C, 9A and 9B show schematic representations of examples of organic light-emitting diodes.

Our organic light-emitting diode may comprise a substrate with a substrate top. The substrate comprises, for example, a glass sheet or a plastics sheet. The substrate is preferably transmissive to radiation generated when the light-emitting diode is in operation. The substrate may be transparent or capable of diffuse scattering.

At least one active organic layer may be located on the substrate top. The one or more active organic layers are configured to generate radiation.

The light-emitting diode may comprise one or more first electrical contact areas and one or more second electrical contact areas. The at least one first contact area, for example, comprises an anode and the at least one second contact area, for example, comprises a cathode. The active organic layer is electrically operable via the electrical contact areas. In particular, the contact areas are in direct electrical contact with electrodes of the light-emitting diode, between which the active organic layer is applied.

The electrical contact areas may be applied to or on the substrate top. The electrical contact areas may be located wholly or partly directly on the substrate top. Alternatively, the contact areas may be separated from the substrate top by a further component of the light-emitting diode.

The light-emitting diode may comprise at least one cover sheet. The cover sheet is located on a side of the organic layer remote from the substrate. The cover sheet protects the organic layer in particular from environmental influences and mechanical loads. The cover sheet preferably completely covers the organic layer and projects laterally beyond the organic layer.

One or more openings may be formed in the cover sheet. The precisely or at least one opening preferably passes completely through the cover sheet, in particular with a uniform or decreasing diameter.

The opening, when viewed in plan view, may be completely surrounded by the cover sheet and/or by the organic layer. The opening is then located within and not at an edge of the cover sheet.

The electrical contact areas may be applied at one edge of the opening. The edge of the opening is, for example, a face preferably oriented parallel to the active organic layer and directly adjoining the periphery of the opening. A width of the edge is preferably at most as large as a diameter of the opening.

The electrical contact areas or at least one of the electrical contact areas may be freely accessible, in particular in the direction of the substrate top. In other words, at least one of the contact areas, in a direction perpendicular to the substrate top, is then not covered by a further component of the light-emitting diode.

The organic light-emitting diode may comprise a substrate with a substrate top. At least one active organic layer that generates radiation is located at the substrate top. At least one first electrical contact area and at least one second electrical contact area are applied to or on the substrate top for electrical contacting of the light-emitting diode. On a side of the organic layer remote from the substrate, a cover sheet is located to protect the organic layer. An opening is formed in the cover sheet. When viewed in plan view, the opening is completely surrounded by the cover sheet and the organic layer. The electrical contact areas are applied at an edge of the opening and are freely accessible.

In organic light-emitting diodes, electrical contact areas are conventionally located at an outer edge. For a simple, inexpensive, readily operable and/or standardized contacting solution, it is to this end necessary for the organic light-emitting diode to comprise external edges of simple geometry. This means in particular that the external edges are straight edges and the organic light-emitting diode, when viewed in plan view, is rectangular or polygonal in shape. Organic light-emitting diodes with a freely selectable external shape, for instance with a round external shape, can be achieved only with difficulty when using electrical contacting at external edges.

In particular, a free external shape and thus curved external edges each require special contacting conformed to a shape of the respective external edge. Furthermore, particular measures need to be taken to mechanically mount and fasten such a light-emitting diode.

In the organic light-emitting diode described here, the electrical contact areas, when viewed in plan view, are located within the organic light-emitting diode. The areas are internal electrical contact areas. The electrical contact areas are accessible via the opening and at the same time efficient mechanical support is possible via the opening.

In addition, even with simple organic light-emitting diode geometries, there are restrictions, when viewed in plan view, in relation to mounting if the electrical contact areas are located on the outside.

A light-emitting diode is generally pressed against a pressure contact and held there mechanically. To replace the light-emitting diode in external contact areas, the outside of the diode must therefore be gripped and a holding force must be overcome by hand or with a tool. A gap-less or minimum-gap juxtaposition of light-emitting diodes is therefore impossible or possible only to a limited degree if the organic light-emitting diodes are replaceable since space has to be left to the sides for demounting.

In "retrofits," i.e., organic light-emitting diodes which can be mounted in a similar manner to conventional incandescent lamps, mounting via external electrical contact areas is problematic. With the internal contact areas of the light-emitting diode described here, mechanical accommodation and electrical contacting are efficiently possible for retrofits irrespective of external shape. With the arrangements described here, mounting of a holding device separately of mounting of the actual light-emitting diode is also possible, simplifying handling.

The organic light-emitting diodes and arrangements described here thus provide a simple, inexpensive, readily operable, standardizable electromechanical contacting option. Furthermore, simple replacement of organic light-emitting diodes in a luminaire is possible. Free external shapes of the organic light-emitting diode may be achieved. Mounting and arrangement of the organic light-emitting diodes are possible during luminaire construction. Inexpensive and simple base conversion is provided in retrofits. It is possible to use just one base for all retrofits, wherein the light-emitting diodes have different sizes or external shapes. Mechanical and electrical contacting of the holding device and of the base with the organic light-emitting diode is possible at the same location and without wires known as "flying wires." In addition, simple, risk-free screwing-in of the holding device by the operator is enabled, even in large faces and irregular external edge shapes of the separate light-emitting diode. The organic light-emitting diodes may be simply put together during production since the organic light-emitting diode can be connected simultaneously electrically and mechanically with a base or driver merely by a press-on lid or by a cap. Soldering or "flying wires" may thereby be omitted.

The opening may pass through both the cover sheet and the substrate as well as the organic layer. The opening may here have a larger or a smaller diameter in the cover sheet than in the substrate.

The organic layer, when viewed in plan view, may be spaced from the electrical contact areas. The organic layer and the electrical contact areas do not then overlap, when viewed in plan view.

The electrical contact areas or at least one of the contact areas may be freely accessible and electrically contactable through the opening. The at least one contact area is here located preferably directly at the substrate top.

Furthermore, an arrangement is provided which comprises at least one such light-emitting diode. Features of the arrangement are therefore also disclosed for the light-emitting diode and vice versa.

The arrangement may comprise one or more holding devices. The holding device mechanically holds the organic light-emitting diode and contacts it electrically. It is possible for each holding device to be provided for exactly one organic light-emitting diode.

The holding device may engage into the opening or through the opening. When viewed in cross-section, the holding device and the organic light-emitting diode then partly overlap. Preferably, the holding device does not project beyond the organic light-emitting diode when viewed in plan view and relative to an external boundary line of the light-emitting diode. It is possible for a diameter of the holding device to be comparable with a diameter of the opening and for these diameters to differ from one another by at most a factor of 2 or 3 or 5.

The arrangement may comprise at least one organic light-emitting diode and at least one holding device. The holding device engages into the opening of the light-emitting diode or through the opening. The organic light-emitting diode is both mechanically supported and electrically contacted by the holding device, in particular solely by the holding device.

The arrangement may comprise a cap. The cap is located at least in part on a side of the opening remote from the cover sheet.

The cap is configured for reversible fastening of the light-emitting diode to the holding device. The cap may preferably be removed non-destructively from the light-emitting diode and the holding device.

The cap may engage into the holding device. For example, the cap is screwed in part into the holding device. The cap passes partly or completely through the substrate or the cover sheet.

The cap may press the substrate onto the holding device. For example, a pressure surface of the cap lies on a light-emitting substrate front.

The organic light-emitting diode may be planar in shape. The same is also preferably true of the pressure surface of the cap. Alternatively or in addition, the organic light-emitting diode is mechanically rigid. This means that the light-emitting diode does not deform or does not deform significantly when used correctly. It is likewise possible for the light-emitting diode to be mechanically flexible. This may mean that the light-emitting diode may be non-destructively and preferably reversibly bendable, with a bending radius of less than 0.25 m or 0.1 m or 10 mm or 1 mm. The light-emitting diode may also be rigid at the opening and flexible at the outer regions, further away from the opening. Flexible outer regions allow versatile adjustment of a spatial emission pattern of the arrangement.

The thickness of the substrate and/or of the cover sheet may be at least 0.5 mm or 0.6 mm or 0.8 mm. Alternatively or in addition, these thicknesses are at most 3 mm or 2.2 mm or 1.5 mm.

The average diameter of the opening in the cover sheet and/or in the substrate may be at least 2.5 mm or 4 mm or 8 mm or 12 mm and/or at most 50 mm or 40 mm or 30 mm.

The average lateral dimension of the light-emitting diode, when viewed in plan view onto the substrate top, may be at least 20 mm or 40 mm or 80 mm or 150 mm. Alternatively or in addition, this lateral dimension is at most 3 m or 1.5 m or 750 mm or 500 mm or 350 mm.

The projection of the substrate beyond the cover sheet, at the opening and/or at the outer boundary line of the light-emitting diode may have a width of at least 1 mm or 2 mm or 3.5 mm or 5.5 mm. Alternatively or in addition, the projection has a width of at most 12 mm or 10 mm or 8.5 mm.

The electrical contact areas or at least one of the contact areas may comprise a width of at least 1 mm or 2 mm or 3 mm and/or of at most 12 mm or 10 mm or 8 mm or 6 mm or 5 mm. It is possible for the width of the contact areas to be smaller than the width of the projection or indeed equal to the width of the projection.

The contact areas may reach as far as to the opening and/or to the cover sheet, when viewed in plan view. Alternatively, the contact areas may be spaced from the opening and/or the cover sheet, likewise when viewed in plan view.

The electrical contact areas may be located, in particular exclusively, on the projection. The cover sheet preferably projects beyond the contact areas, in a direction away from the substrate top. Alternatively, it is possible for the contact areas or one of the contact areas to be applied to a cover sheet top remote from the substrate, in particular at the edge of the opening.

The holding device may lie solely on the substrate and/or on the electrical contact areas. The holding device is preferably spaced from the cover sheet, such that the holding device then does not touch the cover sheet.

The holding device may comprise a double step. The holding device then preferably lies both on the substrate and/or contact areas and on the cover sheet.

The first contact area may have a different average distance from the opening than the second contact area. In other words, it is possible for one of the contact areas to be spaced further from the opening than another of the contact areas.

The electrical contact areas or at least one of the electrical contact areas may be arranged partly or completely concentrically around the opening. It is possible for at least one of the contact areas to partly or completely encircle the opening, when viewed in plan view.

The opening may be formed asymmetrically in the cover sheet. The opening is, for example, not circular or rotationally symmetrical. Asymmetric may mean that the opening has at most one plane of symmetry, perpendicular to the substrate top. This makes it possible to provide polarity reversal protection. Incorrect mounting of the light-emitting diode relative to the holding device may then be avoided. Such polarity reversal protection may be formed alternatively or additionally in the substrate.

The opening may be formed rotationally symmetrically in the substrate and/or in the cover sheet. The opening then has a circular shape, when viewed in plan view.

The arrangement may comprise a plurality of light-emitting diodes and a plurality of holding devices. Each of the light-emitting diodes is preferably associated with precisely one of the holding devices. Alternatively, it is possible for a plurality of holding devices to be associated with one of the light-emitting diodes.

The arrangement may comprise one or more carrier. The light-emitting diodes and the holding devices are applied to the carrier and preferably integrated mechanically and connected together by way of the carrier. The carrier may comprise electrical lines for interconnection of the light-emitting diodes.

The light-emitting diodes may be applied to the carrier by the holding devices. The carrier for instance comprises a continuous lattice frame or a larger, continuous sheet. The carrier may take the form of a heat sink or of a cooling device, for example, with ventilation means/ventilator.

The light-emitting diodes may be arranged on the carrier in a common plane. The light-emitting diodes may be arranged on the carrier regularly and in the manner of a matrix or indeed irregularly.

The average spacing between two adjacent light-emitting diodes on the carrier may be at most 3 mm or 2 mm or 1 mm and/or at most 5% or 2.5% of an average diameter of the light-emitting diodes. In other words, any space between two adjacent light-emitting diodes is negligibly small.

The holding device may comprise an electrical drive unit. The drive unit operates the light-emitting diodes electrically. For example, the drive unit comprises a DC-DC converter or an AC-DC converter.

The holding device may comprise, on a side remote from the light-emitting diode, a pin base, a bayonet base or a screw base, in particular an E27 screw base. By way of such bases the holding device is externally electrically contactable and mechanically fastenable, for example, in the holder for an incandescent lamp.

The holding device may comprise a plurality of spring contacts. The spring contacts press onto the electrical contact areas of the light-emitting diode. This enables reversible, simple and non-destructive electrical contacting of the light-emitting diodes.

Bearing faces of the holding device may be oriented parallel to the electrical contact areas of the light-emitting diode. The at least one bearing face of the holding device is in contact in places or over the entire surface with the contact areas of the light-emitting diode.

The electrical contact areas of the light-emitting diode, electrical connections between the electrical contact areas and/or electrodes of the light-emitting diode, which are located between the substrate and cover sheet, may render current feed to the organic layer uniform. This ensures that the light-emitting diode emits radiation uniformly at the substrate front and brightness does not decrease or does not decrease significantly, for example, in the direction away from the opening.

This may be achieved for instance by a plurality of electrical contact areas electrically interconnected on a side of the cover sheet remote from the substrate. The electrodes, in particular an electrode based on a transparent, conductive oxide, may moreover be provided with a thin, metallic honeycomb structure to improve electrical conductivity and current distribution. The electrodes may also be comparatively thick or have a thickness curve.

The substrate, the organic layer and/or the cover sheet may comprise winding boundary lines, around part or all of them, when viewed in plan view. In particular, the light-emitting diode, when viewed in plan view, has an irregular external shape. This is made possible in particular by the internal electrical contact areas.

An organic light-emitting diode described here and an arrangement described here will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

Figure 1B:
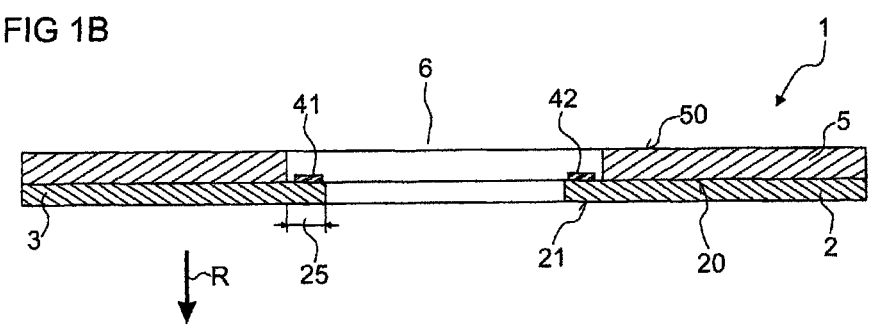

FIG. 1A shows a perspective representation and FIG. 1B a sectional representation of an example of an organic light-emitting diode 1. The light-emitting diode 1 comprises a substrate 2. An organic active layer 3 that generates radiation is applied to a substrate top 20. The organic layer 3 is only shown in a highly schematic manner.

Furthermore, the light-emitting diode 1 comprises a cover sheet 5 with a sheet top 50 remote from the substrate top 20. Radiation R is emitted at a substrate front 21 opposite the substrate top 20. No radiation is preferably emitted at the sheet top 50. It is likewise possible for the light-emitting diode 1 to be radiation-transmissive and/or also to emit light at the sheet top 50, for instance for an indirect lighting device. Electrodes that feed current to the organic layer 3 and additional encapsulation layers which are located between the substrate 2 and the cover sheet 5 are not shown in the figures to simplify the representation.

An opening 6 is formed in the substrate 2 and in the cover sheet 5. In the cover sheet 5, the opening 6 has a larger average diameter. In addition, polarity reversal protection 9 is formed by a recess or groove in the cover sheet 5 as shown in FIG. 1A.

On a projection 25 of the substrate 2 beyond the cover sheet 5 at the opening 6 there are located first electrical contact areas 41 and second electrical contact areas 42. The contact areas 41, 42 are arranged in the form of arcs of a circle around the opening 6. The contact areas 41, 42 are located directly at the opening 6. The contact areas 41, 42 are applied directly to the substrate top 20, oriented parallel to the substrate top 20 and to the sheet top 50 and of two-dimensional configuration.

Figure 2:
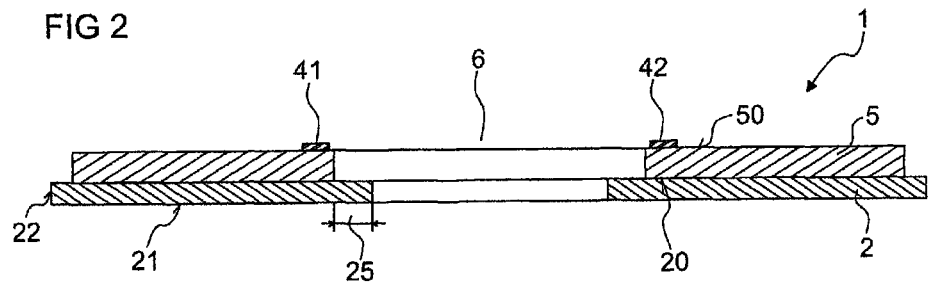

FIG. 2 is a sectional representation of a further example of the light-emitting diode 1. According to FIG. 2, the electrical contact areas 41, 42 are located on the sheet top 50 remote from the substrate 2. Conductor tracks connecting the electrodes, not shown, on the substrate top 20 with the contact areas 41, 42, are not shown.

As also in all the other examples, it is possible for the substrate 2 to project beyond the cover sheet 5 at an outer boundary line 22. Alternatively, the cover sheet 5 and the substrate 2 may terminate flush at the boundary line 22 as shown in FIG. 1B.

Figure 3:
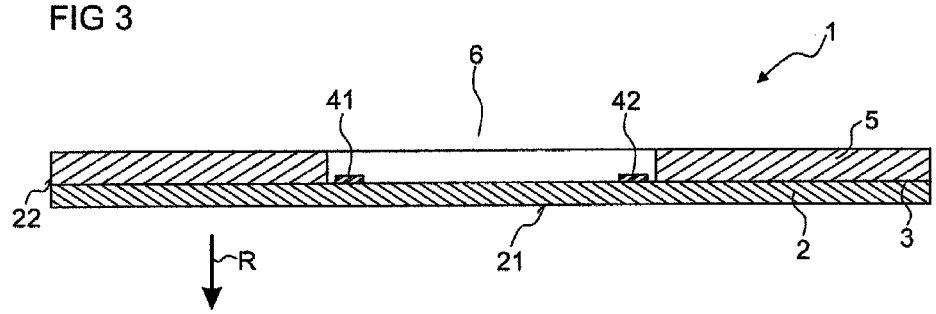

In the example of the light-emitting diode 1 in the sectional representation according to FIG. 3, the opening 6 is only formed in the cover sheet 5. The substrate 2 is continuous and unbroken. The opening 6 exposes the electrical contact areas 41, 42.

Figure 4:
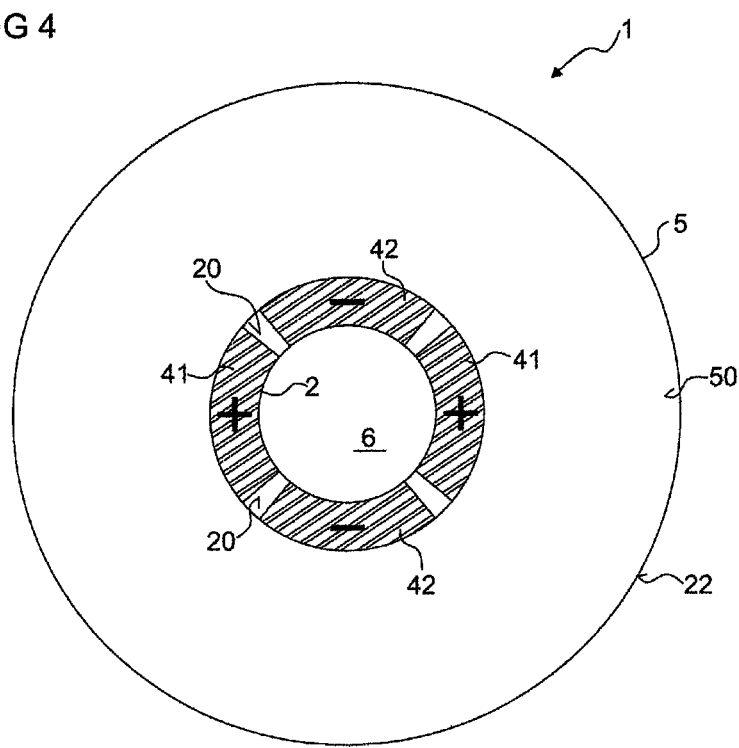

FIG. 4 shows a schematic plan view of an example of the light-emitting diode 1. The light-emitting diode 1 comprises a plurality of first contact areas 41 and a plurality of second contact areas 42 located on the substrate top 20 and encircle the opening 6 in the form of arcs of a circle. The contact areas 41, 42 are separated from one another by narrow gaps. The contact areas 41, 42 preferably cover the majority of the projection 25 when viewed in plan view, for example, at least 50% or 70% or 85% thereof.

Unlike in the illustration, it is possible for the opening 6 not to be circular, but rather to be oval or rectangular, for example, the opening 6 thereby enabling provision of polarity reversal protection in particular in the substrate 2 itself. Also unlike in the illustration, the contact areas 41, 42 may also take the form of a polygonal chain. It is moreover possible for the contact areas 41, 42 to be dot-shaped and only cover a small proportion of the projection 25, for example, at most 10% or 20% or 30%, as is also possible in all the other examples.

Figure 5A:
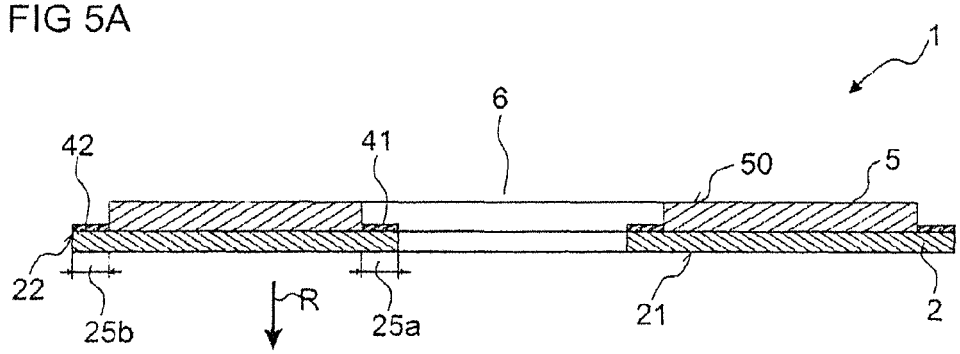
Figure 5A:
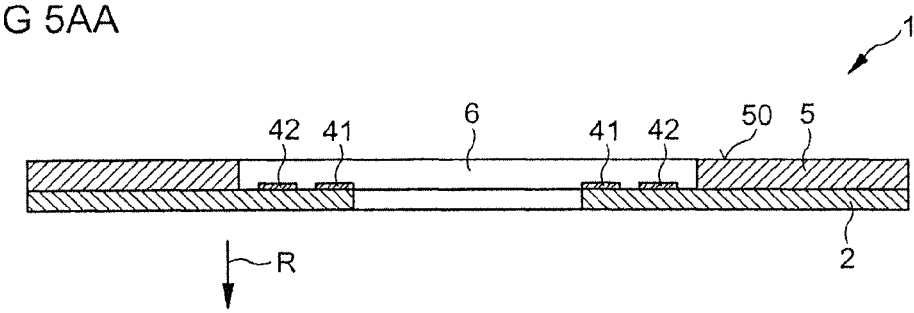
Figure 5B:
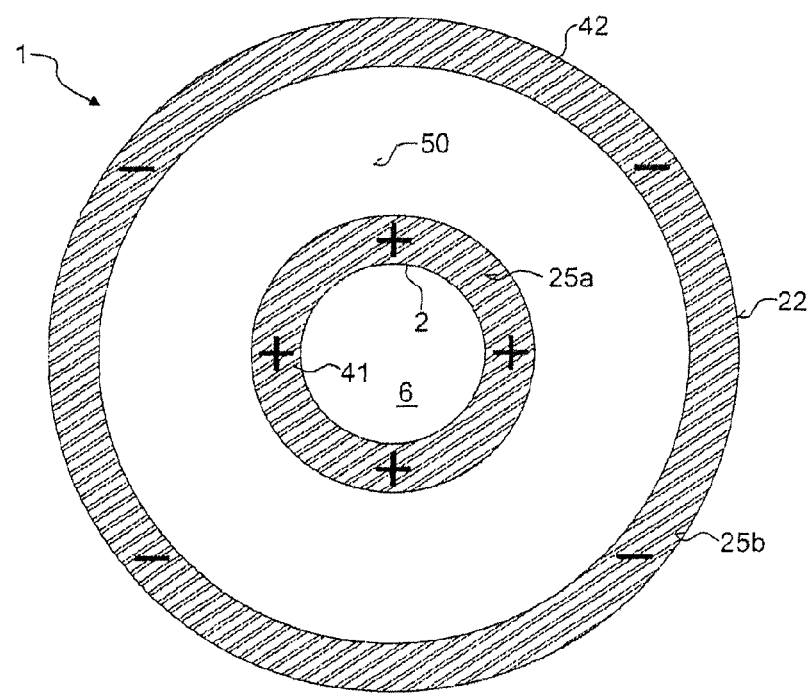
Figure 5C:
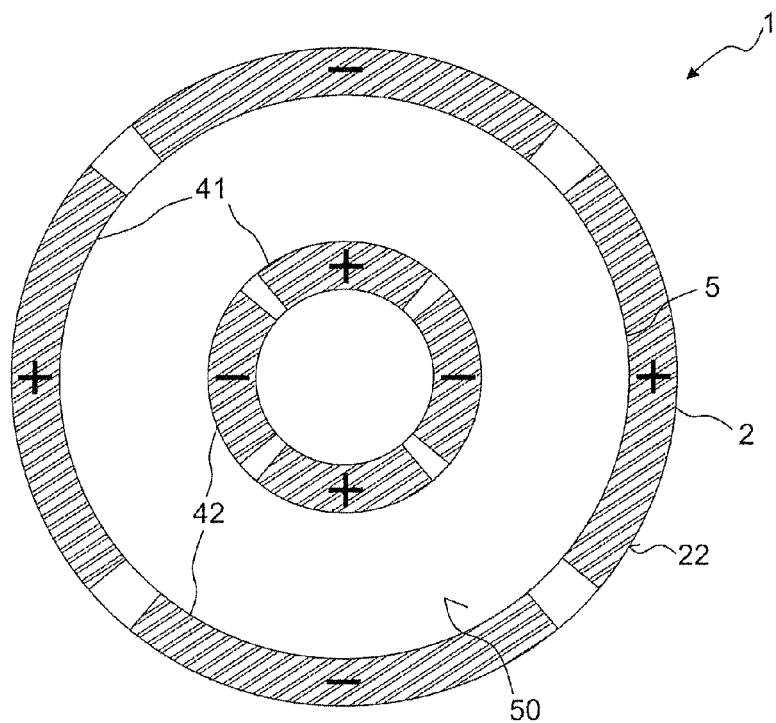

FIGS. 5A and 5AA are schematic sectional representations and FIGS. 5B and 5C illustrate schematic plan views of the light-emitting diode 1. According to FIG. 5A, the substrate 2 comprises a first projection 25a at the opening 6 and a second projection 25b at the boundary line 22. One of the contact areas 41 is located on the second projection 25b .According to FIG. 5AA, both of the contact areas 41 and 42 are located on one projection.

In FIG. 5B, the first contact area 41 is configured as a circle completely encircling the opening 6. Likewise, the second contact face 42 may be configured as an encircling circle on the second projection 25b .In contrast thereto, according to FIG. 5C, the contact areas 41, 42 are each distributed over the two projections 25a, 25b and take the form of arcs of a circle.

As in all the other example, it is possible that the organic light-emitting diode 1, when viewed in plan view, each have only round outer boundary lines 22 and no portions extending straight at the boundary line 22.

Figure 6:
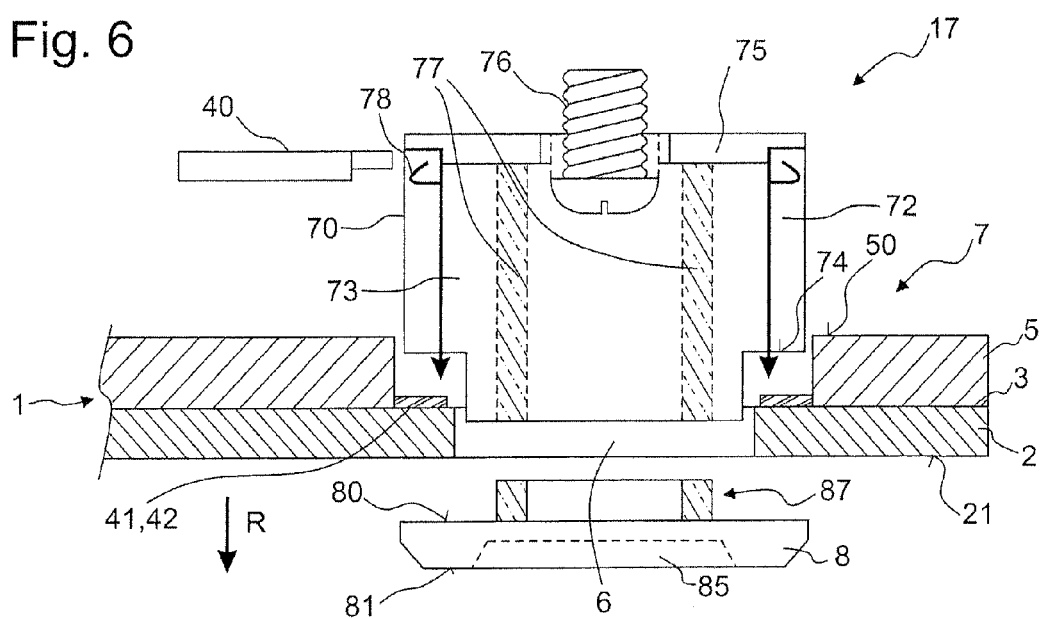
FIGS. 6, 7A, 7B, 8 and 10 show schematic representations of examples of arrangements.

FIG. 6 shows a sectional representation of an example of an arrangement 17. The arrangement 17 comprises a light-emitting diode 1, for example, as illustrated in association with FIG. 1. The arrangement 17 further includes a holding device 7 and a cap 8.

The holding device 7 comprises a housing 70, in which an electronic drive unit 73 may be located. The drive unit 73, for example, comprises a DC-DC converter, a sensor unit for instance for brightness, temperature or service life, or a device that dims the light-emitting diode 1.

In addition, bearing faces 74 are provided on the housing 70 and configured to be placed onto the contact areas 41, 42. Electrical contacting proceeds via two spring contacts 72 pressed onto the contact areas 41, 42 when the light-emitting diode 1 is pressed onto the holding device 7 and exert a force on the contact areas 41, 42. The contact springs 72 may alternatively be Pogo pins, an adhesive bond, clips, connectors or a bonded contact.

For external electrical contacting of the holding device 7, an electrical connection device 78 is provided which, for example, is a "push-in contact" for wires. An electrical feed line 40 may be inserted into the connection device 78.

By way of a faceplate 75, the holding device 7 may be fitted to a ceiling or a wall using a fastening unit 76. The fastening unit 76 is, for example, a screw, a sharpened barb, which can be snapped into a lamp back plate, or indeed a plug-in connector.

The cap 8 may be fastened reversibly to the holding device 7 via a holder 77, for example, provided by a screw thread. The cap 8 comprises a fastening unit 87, for example, likewise in the form of a screw thread. Alternatively, the fastening unit 87 may also be provided by a bayonet closure, barbs or by a plug-in connector. The light-emitting diode 1 is pressed via a pressure surface 80 against the bearing faces 74 of the holding device 7. Preferably, the cap 8 and the light-emitting diode 1 can be reversibly removed from the holding device 7.

As also in all the other example, a mounting aid 85 is optionally fitted to an outside 81 of the cap 8. The mounting aid 85 is, for example, a slot for instance to receive a screwdriver or a coin. The outside 81 may be optically conformed to the front 21 of the light-emitting diode 1. The holding device 7 is preferably not visible from the outside when the light-emitting diode 1 has been mounted, due to the cap 8.

Figure 7A:
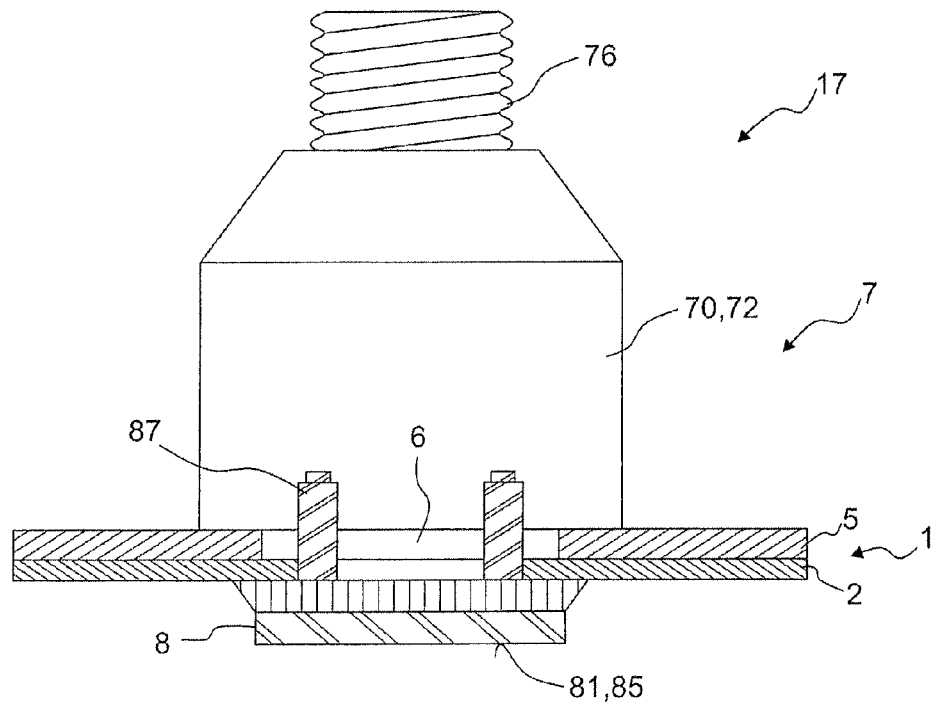
Figure 7B:
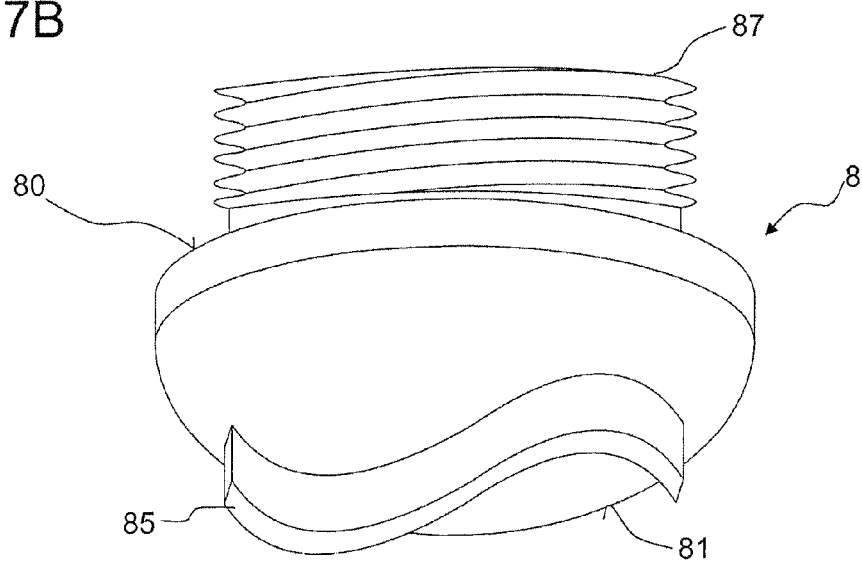

A further example of the arrangement is visible in the sectional representation according to FIG. 7A and in the perspective representation according to FIG. 7B. The holding device 7 with the housing 70 and the drive unit 73 comprises a screw base as fastening unit 76. Via the screw base 76, the holding device 7 may for instance be screwed into the socket for an incandescent bulb and thus may be simultaneously electrically contactable and mechanically fastenable.

The cap 8 may, for example, be screwed into the holding device 7 and may have a handle strip as mounting aid 85 as shown in FIG. 7B. The outside 81 may be hemispherical or indeed planar in shape.

To mount the arrangement 17, first of all the holding device 7 is for instance preferably screwed into a socket. Once the holding device 7 has been fastened in place, the light-emitting diode 1 is then fitted on the holding device 7 by the cap 8. In this way, actual mounting of the light-emitting diode 1 can be decoupled from mounting of the holding device 7. In addition, identically constructed holding devices 7 may be used for a plurality of different-shaped light-emitting diodes 1.

Figure 8:
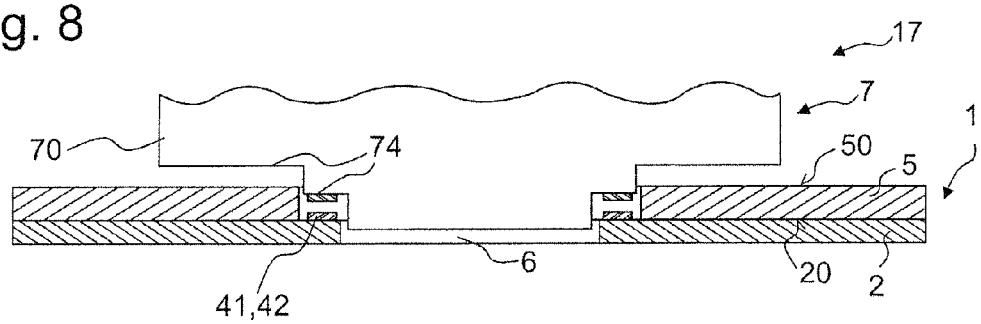

In the arrangement 17 as shown in FIG. 8, the holding device 7 comprises a double step, unlike the single steps of the holding device 7 according to FIGS. 6 and 7. Bearing faces 74 of the holding device 7 preferably lie both on the substrate top 20 with the contact areas 41, 42 and on the sheet top 50. In FIGS. 6 and 8 the holding device 7 is shown not fully pressed onto the light-emitting diode 1. The optional cap is not shown in FIG. 8.

Figure 9A:
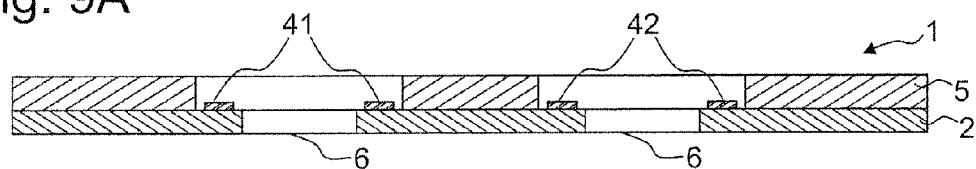
Figure 9B:
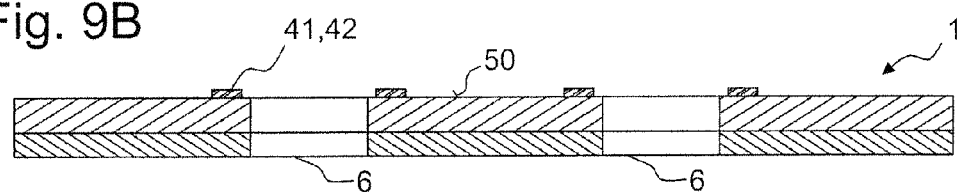

FIGS. 9A and 9B show sectional representations of further examples of the light-emitting diode 1. The light-emitting diode 1 comprises a plurality of openings 6, wherein each of the openings 6 is configured for exactly one of the holding devices, not shown.

According to FIG. 9A, the contact areas 41, 42 are each located in precisely one of the openings 6. It is possible for anode contacting to take place via one of the openings and cathode contacting to take place via another one of the openings.

According to FIG. 9B, the opening 6 has the same diameter in the substrate 2 and in the cover sheet 5 and the substrate 2 and the cover sheet 5 terminate flush with one another in the opening 6. This is also possible in conjunction with all the other examples. Since the substrate 2 does not project beyond the cover sheet 5, the electrical contact areas 41, 42 are located on the sheet top 50. Unlike in the illustration, individual contact areas 41, 42 may each be assigned to one of the openings 6, cf. FIG. 9A.

The plurality of openings 6 allow more uniform current feed to the light-emitting diode 1. Likewise, mechanical forces for supporting the light-emitting diode 1 may be distributed more uniformly, for instance over the substrate 2. As in all the other examples too, it is possible for a plurality of the contact areas 41, 42 on the substrate top 20 or on the sheet top 50 to be connected together via electrical cross-connections, not shown. This also makes it possible to render emission uniform.

It is also possible that non-uniform current feed to the light-emitting diode 1 is desired. This may result in an appearance which is more pleasing to the human eye, in that luminance decreases in the direction away from the openings 6.

Figure 10:
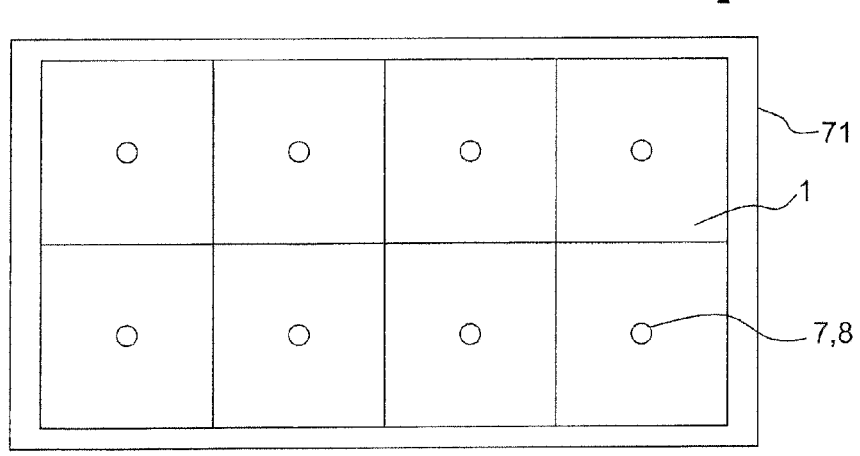

In the arrangement 17 according to FIG. 10, a plurality of light-emitting diodes 1 are fitted on a carrier 71 by the holding devices 7 and the caps 8. The light-emitting diodes 1 are arranged in the manner of a matrix and have no or no significant spaces between them. Unlike in the illustration, it is not necessary for the carrier 71 to protrude laterally beyond the light-emitting diodes 1. The carrier 71 may take the form of a sheet, a lattice structure or may be reticular.

Unlike in the illustration, it is possible, as in all the other examples too, for the opening 6 for instance to be conical in shape to center the light-emitting diode 1 on the holding device 7.

The OLEDs and arrangement described here are not restricted by the description given with reference to the examples. Rather, this disclosure encompasses any novel feature and any combination of features, including in particular any combination of features in the appended claims, even if the feature or combination is not itself explicitly indicated in the claims or examples.

This application claims priority from DE 10 2013 107 057.4, the disclosure of which is hereby incorporated by reference.

The invention claimed is:

1. An organic light-emitting diode comprising:
    a substrate with a substrate top and having first and second projections;
    at least one active organic layer on the substrate top that generates radiation;
    at least one first and at least one second electrical contact area at or on the substrate top that electrically contacts the light-emitting diode;
    a holding device by which the organic light-emitting diode is both mechanically supported and electrically contacted; and
    a cover sheet on a side of the organic layer remote from the substrate that protects the organic layer,
    wherein
    at least one opening is formed in the cover sheet and the opening, when viewed in plan view, is completely surrounded by the cover sheet and the organic layer;
    one of the electrical contact areas is located at an edge of the opening and are freely accessible;
    the holding device engages through the opening;
    the first contact area has a different average distance from the opening than the second contact area;
    the electrical contact areas are each arranged concentrically around the opening and each partially or completely surround the opening when viewed in plan view;

the first and second projections of the substrate extend beyond the cover sheet, the first electric contact area is located on the first projection and the second contact area is located on the second projection, the first projection is located directly at the openings; and the second projection is located at an outer boundary line of the substrate.

2. The organic light-emitting diode according to claim 1, wherein the opening passes through both the cover sheet and the substrate and the organic layer, when viewed in plan view, is spaced from the electrical contact areas, the opening has a smaller diameter in the substrate than in the cover sheet, and the electrical contact areas are freely accessible and electrically contactable through the opening in the cover sheet.

3. An arrangement comprising at least one organic light-emitting diode according to claim 1, wherein the holding device is fitted to a ceiling or a wall using a fastening unit, the fastening unit is at least one of a screw, a sharpened barb, or a plug-in connector.

4. The arrangement according to claim 3, wherein the opening passes through both the cover sheet and the substrate and the organic layer, when viewed in plan view, is spaced from the electrical contact areas, the opening has a smaller diameter in the substrate than in the cover sheet, the electrical contact areas are electrically contactable through the opening in the cover sheet, and the arrangement further comprises a cap located on a side of the opening remote from the cover sheet that reversibly fastens the light-emitting diode to the holding device and engages into the holding device and presses the substrate onto the holding device.

5. The arrangement according to claim 3, wherein the organic light-emitting diode is planar in shape and mechanically rigid, thicknesses of the substrate and of the cover sheet are each 0.5 mm to 3 mm, an average diameter of the opening is 4 mm to 40 mm, an average lateral dimension of the light-emitting diode, when viewed in plan view, is 80 mm to 500 mm, a projection of the substrate beyond the cover sheet at the opening is 2 mm to 10 mm, and the electrical contact areas are located on the projection and have a width of 2 mm to 6 mm.

6. The arrangement according to claim 3, wherein the holding device lies merely on at least one of the substrate and the electrical contact areas and is spaced from the cover sheet.

7. The arrangement according to claim 3, wherein the holding device has a double step and lies both on the cover sheet and on at least one of the substrate and the electrical contact areas.

8. The arrangement according to claim 3, further comprising a plurality of light-emitting diodes and a plurality of holding devices, and a carrier, wherein the organic light-emitting diodes are fitted on the carrier in a matrix in a common plane by the holding devices.

9. The arrangement according to claim 3, wherein the holding device comprises an electronic drive unit, and the holding device is electrically contacted and mechanically fastened on a side remote from the light-emitting diode to a pin base, a bayonet base or a screw base.

10. The arrangement according to claim 3, wherein the holding device comprises a plurality of spring contacts that press onto the electrical contact areas, and bearing faces of the holding device are oriented parallel to the electrical contact areas and touch the electrical contact areas at least in places.

11. The arrangement according to claim 3, wherein the electrical contact areas of the organic light-emitting diode located between the substrate and the cover sheet render current feed to the organic layer uniform.

12. The arrangement according to claim 3, wherein the substrate, the organic layer and the cover sheet at least in part comprise winding boundary lines, when viewed in plan view.

13. An organic light-emitting diode comprising:

a substrate with a substrate top;

at least one active organic layer on the substrate top that generates radiation;

at least one first and at least one second electrical contact area at or on the substrate top that electrically contact the light-emitting diode; and a cover sheet on a side of the organic layer remote from the substrate that protects the organic layer, wherein at least one opening is formed in the cover sheet and the opening, when viewed in plan view, is completely surrounded by the cover sheet and by the organic layer, the electrical contact areas are located at an edge of the opening and are freely accessible, the first contact area has a different average distance from the opening than the second contact area, and the electrical contact areas are each arranged concentrically around the opening and each partially or completely surround the opening when viewed in plan view.

* * * * *